United States Patent [19]

Yasuda et al.

[11] Patent Number: 4,567,380

[45] Date of Patent: Jan. 28, 1986

[54] SCHMITT TRIGGER CIRCUIT

[75] Inventors: Yasushi Yasuda, Machida; Hiromu Enomoto; Yoshiki Shimauchi, both of Kawasaki; Akinori Tahara, Zushi, all of Japan

[73] Assignee: Fujitsu Limited, Kawasaki, Japan

[21] Appl. No.: 507,496

[22] Filed: Jun. 24, 1983

[30] Foreign Application Priority Data

Jun. 29, 1982 [JP] Japan ................... 57-110611

[51] Int. Cl.[4] .......................................... H03K 3/295
[52] U.S. Cl. .................... 307/290; 307/359; 307/555
[58] Field of Search ............... 307/290, 359, 542, 555, 307/559, 565

[56] References Cited

U.S. PATENT DOCUMENTS 3,035,188 5/1962 Asseo .................... 307/290
4,409,495 10/1983 Enomoto et al. ........... 307/290

Primary Examiner—John Zazworsky
Attorney, Agent, or Firm—Staas & Halsey

[57] ABSTRACT

A level shift element is connected between a transistor (Tr5) which is used to determine a threshold level when the input voltage falls and a diode (D3) is connected between an input terminal and an output control transistor (Tr2) to discharge the base of the output control transistor. The level shift element comprises a diode connected in the forward direction or a resistor.

6 Claims, 10 Drawing Figures

SCHMITT TRIGGER CIRCUIT

BACKGROUND OF THE INVENTION (1) Field of the Invention

The present invention relates to a Schmitt trigger circuit which exhibits hysteresis in response to an input voltage.

(2) Description of the Prior Art

In a Schmitt trigger circuit, the threshold level is high with respect to the rise of an input voltage (from an L level to an H level) and is low with respect to the fall of the input voltage (from the H level to the L level). This hysteresis means a Schmitt trigger circuit has large noise margins and furthermore is free from the oscillation which plagues a transistor-transistor logic (TTL) circuit having a fixed threshold level. Therefore, a Schmitt trigger circuit is preferably used for an input buffer of a long bus line in which noise easily enters and causes distortion of the wave shapes of signals therein.

A conventional type of Schmitt trigger circuit used for input buffers has a serious problem in that the input current abruptly increases by a great deal when the input voltage falls.

SUMMARY OF THE INVENTION

It is, therefore, an object of the present invention to provide a Schmitt trigger circuit in which the input current does not abruptly and greatly increase when the input voltage falls.

The above object is achieved by a Schmitt trigger circuit which includes an input stage having a first transistor and a load resistor connected to each other in series, an output stage and a second transistor inserted between the input stage and the output stage. The second transistor is turned on and off depending upon an input voltage applied to the first transistor and controls the output stage. A first circuit has a first diode which is connected between one terminal of the first transistor and the base of the second transistor, the forward voltage drop of the first diode determining a threshold level of the input voltage to turn on the second transistor. A third transistor is connected in parallel with the first diode for clamping the forward voltage of the first diode so as to determine a threshold level of the input voltage to turn off the second transistor. A second circuit turns on the third transistor when the second transistor turns on and a third circuit has a second diode which is connected between the bases of the first and second transistors, for discharging charges stored in the base of the second transistor. A level shift means is connected between the third transistor and an anode terminal of the second diode.

The above and other related objects and features of the present invention will be apparent from the description of the present invention set forth below, with reference to the accompanying drawings, as well as from the appended claims.

DESCRIPTION OF THE PREFERRED EMBODIMENTS

Before describing a Schmitt trigger circuit of the present invention, conventional Schmitt trigger circuits will first be described with reference to the accompanying drawings.

Figure 1A:
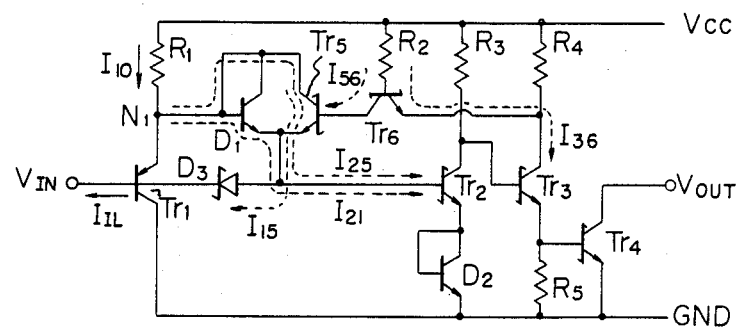
FIGS. 1a and 1b are circuit diagrams of conventional Schmitt trigger circuits.
Figure 1B:
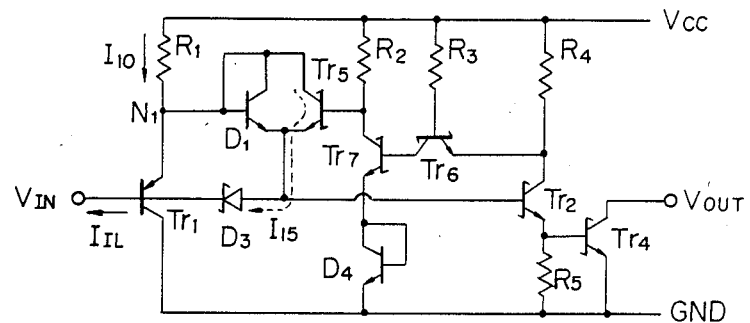

FIG. 1a is a circuit diagram of a conventional non-inverting type Schmitt trigger circuit and FIG. 1b a conventional inverting type Schmitt trigger circuit. Referring to FIG. 1a, $Tr_1$ denotes a PNP transistor in an input stage, $Tr_2$ and $Tr_3$ denote NPN transistors which constitute a phase-splitter, $Tr_4$ denotes an NPN transistor in an output stage, $Tr_5$ denotes an NPN transistor for forming hysteresis, and $Tr_6$ denotes an NPN transistor for controlling the NPN transistor $Tr_5$. The transistors $Tr_2$ to $Tr_6$ are composed of Schottky barrier diode (SBD) clamped transistors.

A PN diode $D_1$ which is formed by shorting the collector and base of an NPN transistor is connected between the emitter and collector of the transistor $Tr_5$. A PN diode $D_2$, which is formed by shorting the collector and base of an NPN transistor, is connected between the trasistor $Tr_2$ and ground.

A Schottky barrier diode (SBD) $D_3$ is connected in the forward direction between the base of the transistor $Tr_2$ and the base of the transistor $Tr_1$, the base of the transistor $Tr_1$ is an input terminal of the Schmitt trigger circuit. The diode $D_3$ is used to discharge the base of the transistor $Tr_2$ so as to speed up the turning off of the transistor $Tr_2$ when the input voltage $V_{IN}$ falls.

The anode (base shorted with collector) of the diode $D_1$ is connected to a node $N_1$ of the emitter of the transistor $Tr_1$ and the load resistor $R_1$. The cathode (emitter) of the diode $D_1$ is connected to the base of the transistor $Tr_2$. The diode $D_1$ is used to determine a threshold voltage $V_H$ at the rising of the input voltage $V_{IN}$.

While the input voltage $V_{IN}$ is the L level, for example, zero volts, the transistor $Tr_1$ is in the on state. In this case, the voltage $V_{N1}$ at the node $N_1$ is expressed as $V_{N1} = V_{IN} + V_{BE} = V_{BE}$, where $V_{BE}$ is the base to emitter voltage of the transistor $Tr_1$. Since the forward voltage drop of the diode $D_1$ is $V_{BE}$ and the transistor $Tr_5$ is in the off state, the transistor $Tr_2$ is in the off state. In order to turn on the transistor $Tr_2$, the voltage $V_{N1}$ at the node $N_1$ should be equal to or higher than the sum of $V_{BE}$ of the transistor $Tr_2$ and the voltage of the diodes $D_1$ and $D_2$, namely $V_{N1} \geq 3\ V_{BE}$. Since the input voltage $V_{IN}$ at the input terminal is lower than $V_{N1}$ by $V_{BE}$, if the input voltage $V_{IN}$ is $V_{IN} \geq 2\ V_{BE}$, the transistor $Tr_2$ turns on. In other words, a threshold voltage $V_H$ at the rising of $V_{IN}$ is $V_H = 2\ V_{BE}$.

While $V_{IN} = L$, the transistor $Tr_2$ is in the off state as aforementioned and, thus, the transistors $Tr_3$ and $Tr_4$ are in the on state, causing the output voltage $V_{out}$ to be the L level. In this case, the current $I_{36}$ flows to the transistor $Tr_3$ a resistor $R_2$ and via the base to emitter of the transistor $Tr_6$. The current $I_{56}$ to the transistor $Tr_5$ (which is in the off state), however, does not flow.

When the input voltage $V_{IN}$ is increased from $V_{IN} = L$ to $V_{IN} = 2\ V_{BE}$ (in this case, $V_{N1} = 3\ V_{BE}$), the transistor $Tr_2$ starts to turn on. During this transitional period, the base current to the transistor $Tr_2$ is supplied via the load resistor $R_1$ and the diode $D_1$ as indicated by $I_{21}$. If the transistor $Tr_2$ starts to turn on, the base current of the transistor $Tr_3$ decreases to finally turn off the transistor $Tr_3$. Thus, the transistor $Tr_4$ turns off, causing the output voltage $V_{out}$ to change to the H level. In this case, the current passing through the resistor $R_2$ changes from $I_{36}$ to $I_{56}$. The current $I_{56}$ flows to the base of the transistor $Tr_5$ via the base to the collector of the transistor $Tr_6$ causing the transistor $Tr_5$ to turn on. Since the collector to emitter voltage $V_{CE}$ of the transistor $Tr_5$ during the on state is lower than $V_{BE}$ of the diode $D_1$, the base current to the transistor $Tr_2$ is supplied via the resistor $R_1$ and the collector to the emitter of the transistor $Tr_5$ as indicated by $I_{25}$, after the transistor $Tr_5$ turns on, instead of $I_{21}$. While $V_{IN}=H$, the above state is maintained.

While the input voltage $V_{IN}$ changes from $V_{IN}=H$ to $V_{IN}=L$, the transistor $Tr_2$ turns off. This turning off occurs when the voltage $V_{N1}$ at the node $N_1$ decreases to be equal to or lower than $V_{CE}+2V_{BE}$, which is the sum of $V_{CE}$ of the transistor $Tr_5$, $V_{BE}$ of the transistor $Tr_2$, and $V_{BE}$ of the diode $D_2$. Therefore, when the input voltage $V_{IN}$ becomes $V_{IN} \leq V_{BE}+V_{CE}$, the transistor $Tr_2$ turns off. In other words, the threshold voltage $V_L$ when $V_{IN}$ falls is $V_L = V_{BE} + V_{CE}$.

Figure 2A:
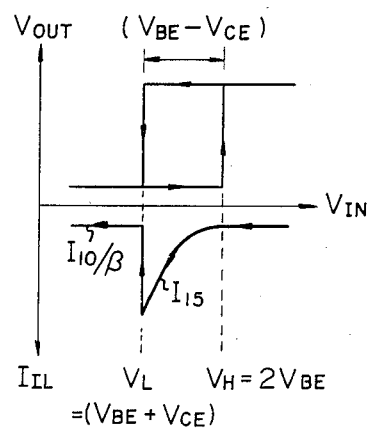
FIGS. 2a and 2b are waveform diagrams of operations of the circuits shown in FIGS. 1a and 1b, respectively.

FIG. 2a is a graph of the hysteresis between the input voltage $V_{IN}$ and the output voltage $V_{out}$, and the input current $I_{IL}$ when the input voltage falls, according to the Schmitt trigger circuit of FIG. 1a. The difference between the threshold voltages $V_H$ and $V_L$ at the rising and falling of the input voltage $V_{IN}$ is indicated as $V_H - V_L = 2V_{BE} - (V_{BE} + V_{CE}) = V_{BE} - V_{CE}$. In general, $V_{BE}$ is about 0.8 V, and $V_{CE}$ is about 0.2 to 0.3 V. Therefore, the difference $V_H - V_L$ which corresponds to a noise margin is at least about 0.4 V.

In the aforementioned Schmitt trigger circuit, there occurs a problem in that the input current $I_{IL}$ abruptly and greatly increases when the input voltage $V_{IN}$ falls. If $V_{IN}$ is decreased from H to L, a part of the current passing through the transistor $Tr_5$, which is in the on state while $V_{IN}=H$, flows to the input terminal via the diode $D_3$ during the transitional period from when $V_{IN}=H$ to when $V_{IN}=L$.

While $V_{IN}=H$, as the current $I_{25}$ flows via the transistor $Tr_2$ and the diode $D_2$, the voltage at the emitter of the transistor $Tr_5$ is kept at $2V_{BE}$. In this case, the diode $D_3$ is in the off state. When the input voltage $V_{IN}$ decreases from $V_{IN}=H$ to $V_{IN}+V_F \leq 2V_{BE}$ (where $V_F$ is the forward voltage drop of the diode $D_3$), the diode $D_3$ turns on and the current $I_{15}$ through the diode $D_3$ starts to flow. The current $I_{15}$ causes the input current $I_{IL}$ to instantaneously and greatly increase as indicated in FIG. 2a. The above phenomenon occurs when the relationship between $V_{BETr1}$, $V_{CETr5}$, and $V_{FD3}$ is $V_{BETr1} \geq V_{CETr5} + V_{FD3}$, where $V_{BETr1}$ is the base to emitter voltage of the transistor $Tr_1$, where $V_{CETr1}$ is the collector to emitter voltage of the transistor $Tr_5$, and where $V_{FD3}$ is the forward voltage drop of the diode $D_3$.

The normal input current $I_{IL}$ while $V_{IN}=L$ is equal to the base current $I_{10}/\beta$ of the transistor $Tr_1$, which is extremely small. However, since the above-mentioned current $I_{15}$ flows out without being decreased by $1/\beta$, the input current $I_{IL}$ is extremely increased. Particularly, when the frequency of the input voltage $V_{IN}$ is high, the input current $I_{IL}$ instantaneously increases by a large amount. If the input current $I_{IL}$ increases, the current drawn by a former stage connected to this input terminal becomes very large. This causes the former stage to provide an extremely large capacitive load. Furthermore, if the input current $I_{IL}$ increases, it becomes very difficult to connect a large number of fan-outs.

The same operations are effected in an inverting type Schmitt trigger circuit as shown in FIG. 1b. In this circuit, while $V_{IN}=L$, the transistor $Tr_1$ is in the on state and the transistor $Tr_2$ is in the off state because there is no supply of base current. Therefore, the transistor $Tr_4$ is also in the off state, causing the output voltage $V_{out}$ to be the H level. However, when $V_{IN}$ changes to $V_{IN}=H$, the transistor $Tr_1$ turns off and the transistor $Tr_2$ turns on, because base current is supplied through the resistor $R_1$ and the diode $D_1$. Thus, the transistor $Tr_4$ turns on, causing the output voltage $V_{out}$ to change to the L level.

Figure 2B:
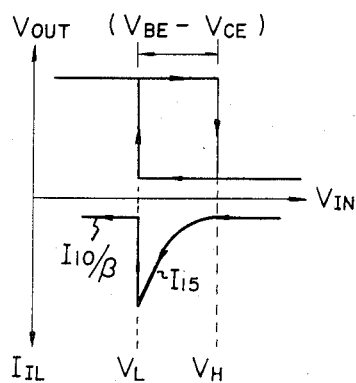

On the other hand, while $V_{IN}$ is the L level and the transistor $Tr_2$ is in the off state, the current passing through the transistor $Tr_6$ flows to the base of the transistor $Tr_7$. Therefore, both the transistor $Tr_7$ and a diode $D_4$ turn on. Thus, the transistor $Tr_5$ turns off. When $V_{IN}$ changes to $V_{IN}=H$, since the transistor $Tr_2$ turns on, the transistor $Tr_6$ stops supplying the base current to the transistor $Tr_7$. As a result, the transistor $Tr_7$ and the diode $D_4$ turn off, and, thus, the transistor $Tr_5$ turns off. In the circuit of FIG. 1b, because the collector-emitter voltage of the transistor $Tr_5$ plus the forward voltage of the diode $D_3$ are applied between the node $N_1$ and the input terminal (that is, between the emitter and the base of transistor $Tr_1$), and because $V_{BETr1} = V_{CETr5} + V_{FD3}$, as mentioned above, the current $I_{15}$ is transitionally produced as shown in FIG. 2b when the input voltage $V_{IN}$ falls.

Figure 3A:
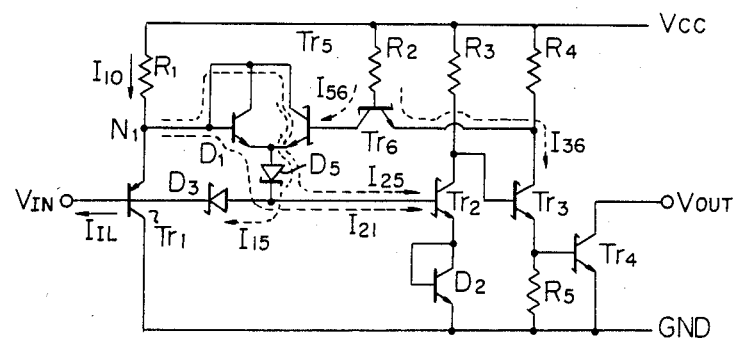
FIGS. 3a and 3b are circuit diagrams of embodiments of the present invention.
Figure 3B:
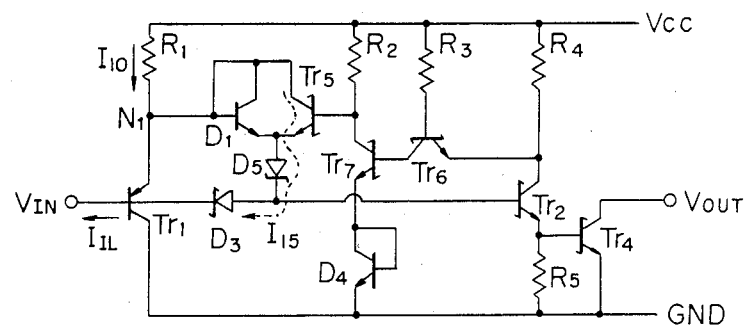

FIGS. 3a and 3b are examples of non-inverting type and inverting type Schmitt trigger circuits according to the present invention, respectively.

The Schmitt trigger circuits of FIGS. 3a and 3b have the same construction as the conventional circuits of FIGS. 1a and 1b, respectively, except that a Schottky barrier diode $D_5$ is connected in the forward direction between the anode of the diode $D_3$ and the emitter of the transistor $Tr_5$.

Hereinafter, the operation of the non-inverting type Schmitt trigger circuit of FIG. 3a is explained. While the input voltage $V_{IN}$ is the L level ($V_{IN}=0$ volt), the transistor $Tr_1$ is in the on state, and thus, the voltage $V_{N1}$ at the node $N_1$ is $V_{N1}=V_{BE}$. The forward voltage drop across the diodes $D_1$ and $D_2$ are $V_{BE}$ and $V_F$. Since the diodes $D_1$ and $D_2$ are connected between the node $N_1$ and the base of the transistor $Tr_2$, the voltage at the base of the transistor $Tr_2$ is zero and, thus, the transistor $Tr_2$ is in the off state in this case. In order to turn on the transistor $Tr_2$, the voltage $V_{N1}$ at the node $N_1$ should be $V_{N1} \geq 3V_{BE}+V_F$. That is, if the input voltage $V_{IN}$ is $V_{IN} \geq 2V_{BE}+V_F$, the transistor $Tr_2$ will turn on. In other words, the threshold voltage $V_H$ at the rising of $V_{IN}$ is $V_H = 2V_{BE}+V_F$. The output voltage $V_{out}$ is the L level when $V_{IN}=L$ as in the case of FIG. 1a.

When the input voltage $V_{IN}$ is increased from $V_{IN}=L$ to $V_{IN}=2V_{BE}+V_F$ (in this case $V_{N1}=3V_{BE}+V_F$), the transistor $Tr_2$ starts to turn on. The base current of the transistor $Tr_2$ at this time is supplied through the load resistor $R_1$ and the diodes $D_1$ and $D_5$ in a manner similar to the current $I_{21}$ as shown in FIG. 1a. When the transistor $Tr_2$ turns on, the transistor $Tr_4$ turns off, causing the output voltage $V_{out}$ to change to the H level. Furthermore, the current $I_{56}$ flows from the transistor $Tr_6$ to the transistor $Tr_5$ to turn on the transistor $Tr_5$. Since the collector to emitter voltage $V_{CE}$ of the on-state transistor $Tr_5$ is lower than $V_{BE}$ of diode $D_1$, base current to the transistor $Tr_2$ is supplied through the resistor $R_1$, the collector to the emitter of the transistor $Tr_5$, and the diode $D_5$ as indicated by $I_{25}$ after the transistor $Tr_5$ turns on, instead of $I_{21}$. While $V_{IN}=H$, the above state is maintained.

While the input voltage $V_{IN}$ changes from $V_{IN}=H$ to $V_{IN}=L$, the transistor $Tr_2$ turns off. This turning off occurs when the voltage $V_{N1}$ at the node $N_1$ decreases to a level equal to or lower than $V_{CE}+2V_{BE}+V_F$, which is the sum of $V_{CE}$ of the transistor $Tr_5$, $V_F$ of the diode $D_5$, $V_{BE}$ of the transistor $Tr_2$, and $V_{BE}$ of the diode $D_2$. Therefore, when the input voltage $V_{IN}$ becomes $V_{IN} \geq V_{BE}+V_{CE}+V_F$, the transistor $Tr_2$ turns off. In other words, the threshold voltage $V_L$ at the falling of $V_{IN}$ is $V_L=V_{BE}+V_{CE}+V_F$.

Figure 4A:
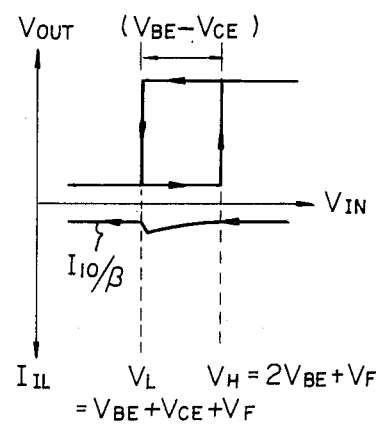
FIGS. 4a and 4b are waveform diagrams of operations of the circuits shown in FIGS. 3a and 3b, respectively.

According to the Schmitt trigger circuit of FIG. 3a, the abrupt and large increase of the input current $I_{IL}$ when the input voltage $V_{IN}$ falls can be prevented. The reason for this is as follows. As aforementioned, the abrupt increase of $I_{IL}$ is due to the existence of the current $I_{15}$, which flows through the collector to the emitter of the transistor $Tr_5$ and the diode $D_3$. In the circuit of FIG. 3a, the voltage along the route of the current $I_{15}$ is $$V_{CETr5}+V_{FD5}+V_{FD3},$$

where $V_{CETr5}$ is the collector to emitter voltage of the transistor $Tr_5$ and $V_{FD5}$ and where $V_{FD3}$ are the forward voltage drops of the diodes $D_5$ and $D_3$, respectively. It is clear that the voltage $$V_{CETr5}+V_{FD5}+V_{FD3}$$

is higher than the base to emitter voltage $V_{BETr1}$ of the transistor $Tr_1$. That is, a relationship of $$V_{BETr1}<V_{CETr5}+V_{FD5}+V_{FD3}$$

exists. Therefore, according to the circuit of FIG. 3a, the current $I_{15}$ is very small even when the input voltage $V_{IN}$ falls, as shown in FIG. 4a. Of course, this circuit functions to discharge from the base of the transistor $Tr_2$ as does the conventional circuit of FIG. 1a.

Figure 4B:
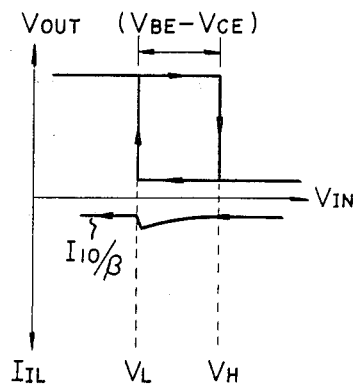

In the inverting type Schmitt trigger circuit of FIG. 3b, the abrupt and great increase of the input current $I_{IL}$ when $V_{IN}$ falls can be prevented as shown in FIG. 4b, for the same reason as the circuit of FIG. 3a.

Figure 5A:
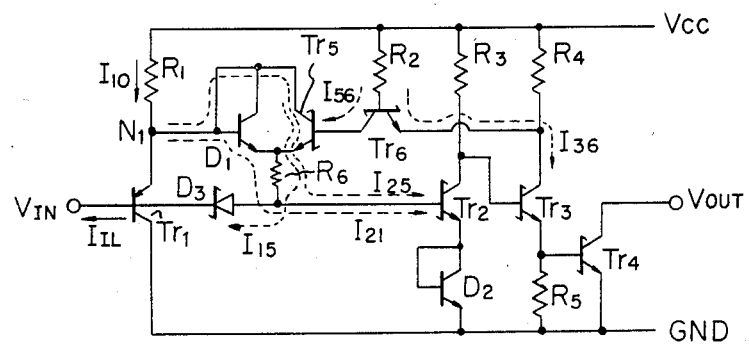
FIGS. 5a and 5b are circuit diagrams of other embodiments of the present invention.
Figure 5B:
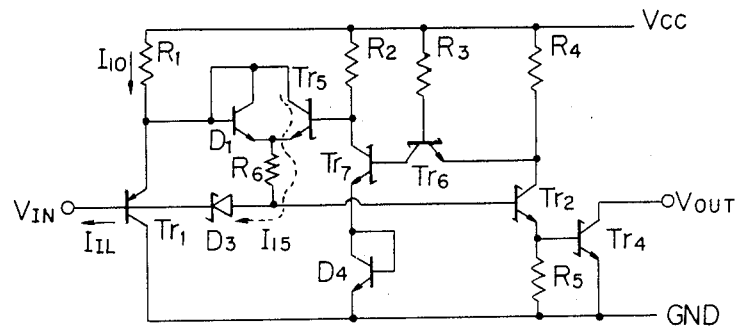

FIGS. 5a and 5b are other examples of non-inverting type and inverting type Schmitt trigger circuits according to the present invention.

The Schmitt trigger circuits of FIGS. 5a and 5b have almost the same construction as those of the respective circuits of FIGS. 3a and 3b, except that a resistor $R_6$ is used instead of the diode $D_5$. The resistance of the resistor $R_6$ is designed so that voltage drop across the resistor $R_6$ is almost equal to $V_F$. The operations and effects of these examples of FIGS. 5a and 5b are also the same as that of FIGS. 3a and 3b.

From the description hereinbefore, in a Schmitt trigger circuit according to the present invention, a level shift element such as a diode $D_5$ or a resistor $R_6$ is connected between a third transistor $Tr_5$ and an anode of a second diode $D_3$. Therefore, a large and abrupt increase of the input current $I_{IL}$ when the input voltage falls can be reliably prevented. Accordingly, increasing the capacitance of a load in the former stage connected to this circuit is not required. Furthermore, a large number of fan-outs can be connected.

As many widely different embodiments of the present invention may be constructed without departing from the spirit and scope of the present invention, it should be understood that the present invention is not limited to the specific embodiments described in this specification, except as defined in the appended claims.

We claim:

1. A Schmitt trigger circuit operatively connected to receive an input voltage and an input current and operatively connected to a power source and ground, comprising:

an input stage comprising:
  a first transistor having a base operatively connected to receive the input voltage, having a collector operatively connected to ground, and having an emitter operatively connected to the power source; and
  a load resistor operatively connected between the emitter of said first transistor and the power source;
an output stage operatively connected to said input stage;
a second transistor operatively connected between said input stage and said output stage, having a base operatively connected to receive the input voltage, having an emitter operatively connected to ground, and having a collector operatively connected to the power source, said second transistor being turned on and off in dependence upon the input voltage, for controlling said output stage;
first circuit means including a first diode having a first terminal operatively connected to the emitter of said first transistor, and having a second terminal operatively connected to the base of said second transistor, the forward voltage drop of said first diode determining a threshold level of the input voltage to turn on said second transistor;
a third transistor, operatively connected in parallel with said first diode, having a collector operatively connected to the first terminal of said diode, having an emitter operatively connected to the second terminal of said diode, and having a base, for clamping the forward voltage of said first diode so as to determine a threshold level of the input voltage to turn off said second transistor;
second circuit means, operatively connected to said third transistor, for turning on said third transistor when said second transistor turns on;
third circuit means including a second diode having a cathode terminal operatively connected to the base of said first transistor and having an anode terminal operatively connected to the base of said second transistor, for discharging charges stored in the base of said second transistor; and
level shift means, operatively connected between the emitter of said third transistor and the anode terminal of said second diode, for preventing an abrupt increase in the input current when the input voltage decreases.

2. A Schmitt trigger circuit as claimed in claim 1, wherein said level shift means comprises a third diode having an anode operatively connected to the emitter of said third transistor, and having a cathode operatively connected to the anode terminal of said second diode.

3. A Schmitt trigger circuit as claimed in claim 1, wherein said level shift means comprises a resistor having a first terminal operatively connected to the emitter of said third transistor and having a second terminal operatively connected to the anode terminal of said second diode.

4. A Schmitt trigger circuit receiving an input voltage and operatively connected to a power source and ground, comprising:

- a first transistor having a base operatively connected to receive the input voltage, having an emitter operatively connected to the power source, and having a collector operatively connected to ground;
- a second transistor having a base operatively connected to the base of said first transistor, having a collector operatively connected to the power source, and having an emitter operatively connected to ground;
- a first diode having a cathode operatively connected to the base of said first transistor and an anode operatively connected to the base of said second transistor;
- a level shift circuit having a first terminal operatively connected to the anode of said first diode and having a second terminal;
- a diode circuit having a first terminal operatively connected to the second terminal of said level shift circuit and having a second terminal operatively connected to the emitter of said first transistor; and
- a third resistor having a collector operatively connected to the second terminal of said diode circuit, having an emitter operatively connected to the second terminal of said level shift circuit, and having a base.

5. A Schmitt trigger circuit according to claim 4, wherein said level shift circuit comprises a second diode, said first terminal being the anode of said second diode and said second terminal being the cathode of said second diode.

6. A Schmitt trigger circuit according to claim 4, wherein said level shift circuit comprises a resistor.

* * * * *

UNITED STATES PATENT AND TRADEMARK OFFICE
CERTIFICATE OF CORRECTION

PATENT NO. : 4,567,380
DATED : JANUARY 28, 1986
INVENTOR(S) : YASUSHI YASUDA ET AL.

It is certified that error appears in the above-identified patent and that said Letters Patent is hereby corrected as shown below:

FRONT PAGE [57] ABSTRACT, line 3, after "falls" insert --,--.

Col. 2, line 14, after "1b" insert --is--;
        line 63, delete "via".

Col. 3, line 61, "$V_{CETr_1}$" should be --$V_{CETr_5}$--.

Col. 5, line 36, "$V_{FD5}$ and where" should be --where $V_{FD5}$ and--.

Col. 8, line 12, "resistor" should be --transistor--.

Signed and Sealed this

Seventeenth Day of June 1986

[SEAL]

Attest:

DONALD J. QUIGG

Attesting Officer

Commissioner of Patents and Trademarks